(12) United States Patent
Yuan

(10) Patent No.: US 7,615,820 B2
(45) Date of Patent: Nov. 10, 2009

(54) SELF-ALIGNED TRENCHES WITH GROWN DIELECTRIC FOR HIGH COUPLING RATIO IN SEMICONDUCTOR DEVICES

(75) Inventor: Jack H Yuan, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/120,134

(22) Filed: May 13, 2008

(65) Prior Publication Data
US 2008/0211007 A1 Sep. 4, 2008

Related U.S. Application Data

(62) Division of application No. 10/996,030, filed on Nov. 23, 2004, now Pat. No. 7,381,615.

(51) Int. Cl.
H01L 29/76 (2006.01)
(52) U.S. Cl. .................... 257/314; 257/E27.06
(58) Field of Classification Search ............ 257/314, 257/E27.06
See application file for complete search history.

(56) References Cited

U.S. PATENT DOCUMENTS

| 5,043,940 | A | 8/1991 | Harari |
| 5,070,032 | A | 12/1991 | Yuan |
| 5,095,344 | A | 3/1992 | Harari |
| 5,168,465 | A | 12/1992 | Harari |
| 5,172,338 | A | 12/1992 | Mehrota |
| 5,198,380 | A | 3/1993 | Harari |
| 5,268,318 | A | 12/1993 | Harari |
| 5,268,319 | A | 12/1993 | Harari |
| 5,297,148 | A | 3/1994 | Harari et al. |
| 5,313,421 | A | 5/1994 | Guterman |
| 5,315,541 | A | 5/1994 | Harari |
| 5,343,063 | A | 8/1994 | Yuan |
| 5,346,842 | A | 9/1994 | Bergemont |
| 5,380,672 | A | 1/1995 | Yuan |

(Continued)

FOREIGN PATENT DOCUMENTS

EP 0555039 9/1998

(Continued)

OTHER PUBLICATIONS

Y. Takeuchi, et al., "A Self-Aligned STI Process Integration for Low Cost and Highly Reliable 1Gbit Flash Memories," 1998 Symposium on VLSI Technology—Digest of Technical Papers, Jun. 9-11, 1998, p. 102.

(Continued)

*Primary Examiner*—David S Blum
(74) *Attorney, Agent, or Firm*—Vierra Magen Marcus & DeNiro LLP

(57) ABSTRACT

Self-aligned trench filling to isolate active regions in high-density integrated circuits is provided. A deep, narrow trench is etched into a substrate between active regions. The trench is filled by growing a suitable dielectric such as silicon dioxide. The oxide grows from the substrate to fill the trench and into the substrate to provide an oxide of greater width and depth than the trench. Storage elements for a NAND type flash memory system, for example, can be fabricated by etching the substrate to form the trench after or as part of etching to form NAND string active areas. This can ensure alignment of the NAND string active areas between isolation trenches. Because the dielectric growth process is self-limiting, an open area resulting from the etching process can be maintained between the active areas. A subsequently formed inter-gate dielectric layer and control gate layer can fill the open area to provide sidewall coupling between control gates and floating gates.

19 Claims, 13 Drawing Sheets

U.S. PATENT DOCUMENTS

| | | | |
|---|---|---|---|
| 5,464,999 | A | 11/1995 | Bergemont |
| 5,512,505 | A | 4/1996 | Yuan |
| 5,528,547 | A | 6/1996 | Aritome et al. |
| 5,534,456 | A | 7/1996 | Yuan |
| 5,554,553 | A | 9/1996 | Harari |
| 5,579,259 | A | 11/1996 | Samachisa |
| 5,595,924 | A | 1/1997 | Yuan |
| 5,640,032 | A | 6/1997 | Tomioka |
| 5,650,345 | A | 7/1997 | Ogura et al. |
| 5,654,217 | A | 8/1997 | Yuan |
| 5,661,053 | A | 8/1997 | Yuan |
| 5,661,055 | A | 8/1997 | Hsu et al. |
| 5,677,872 | A | 10/1997 | Samachisa |
| 5,680,345 | A | 10/1997 | Hsu et al. |
| 5,712,179 | A | 1/1998 | Yuan |
| 5,712,180 | A | 1/1998 | Guterman et al. |
| 5,747,359 | A | 5/1998 | Yuan |
| 5,756,385 | A | 5/1998 | Yuan |
| 5,786,988 | A | 7/1998 | Harari |
| 5,847,425 | A | 12/1998 | Yuan |
| 5,867,429 | A | 2/1999 | Chen |
| 5,883,409 | A | 3/1999 | Guterman |
| 5,895,253 | A | 4/1999 | Akram |
| 5,923,976 | A | 7/1999 | Kim |
| 5,965,913 | A | 10/1999 | Yuan |
| 5,976,950 | A | 11/1999 | DiSimone et al. |
| 5,981,335 | A | 11/1999 | Chi |
| 5,999,448 | A | 12/1999 | Kurihara |
| 6,008,526 | A | 12/1999 | Kim |
| 6,028,336 | A | 2/2000 | Yuan |
| 6,033,970 | A | 3/2000 | Park |
| 6,046,935 | A | 4/2000 | Takeuchi et al. |
| 6,057,580 | A | 5/2000 | Watanabe et al. |
| 6,103,573 | A | 8/2000 | Harari |
| 6,151,248 | A | 11/2000 | Harari |
| 6,166,409 | A | 12/2000 | Ratnam |
| 6,177,317 | B1 | 1/2001 | Huang et al. |
| 6,177,333 | B1 | 1/2001 | Rhodes |
| 6,204,122 | B1 | 3/2001 | Joo |
| 6,208,545 | B1 | 3/2001 | Leedy |
| 6,222,225 | B1 | 4/2001 | Nakamura et al. |
| 6,222,762 | B1 | 4/2001 | Guterman et al. |
| 6,232,646 | B1 | 5/2001 | Sun et al. |
| 6,235,586 | B1 | 5/2001 | Au |
| 6,239,003 | B1 | 5/2001 | Rao |
| 6,251,750 | B1 | 6/2001 | Lee |
| 6,258,665 | B1 | 7/2001 | Shimizu |
| 6,268,249 | B1 | 7/2001 | Ha |
| 6,274,419 | B1 | 8/2001 | Omid-Zohor |
| 6,281,075 | B1 | 8/2001 | Yuan et al. |
| 6,294,423 | B1 | 9/2001 | Malik et al. |
| 6,297,097 | B1 | 10/2001 | Jeong |
| 6,417,538 | B1 | 7/2002 | Choi |
| 6,429,076 | B1 | 8/2002 | Ratnam |
| 6,440,817 | B2 | 8/2002 | Trivedi |
| 6,455,889 | B2 | 9/2002 | Sakui |
| 6,512,262 | B2 | 1/2003 | Watanabe et al. |
| 6,512,263 | B1 | 1/2003 | Yuan |
| 6,579,777 | B1 | 6/2003 | Yen |
| 6,620,681 | B1 | 9/2003 | Kim et al. |
| 6,657,251 | B1 | 12/2003 | Meguro |
| 6,689,658 | B2 | 2/2004 | Wu |
| 6,700,159 | B2 | 3/2004 | Kobayashi |
| 6,713,834 | B2 | 3/2004 | Mori et al. |
| 6,762,092 | B2 | 7/2004 | Yuan |
| 6,856,001 | B2 | 2/2005 | Rhodes |
| 6,881,994 | B2 | 4/2005 | Lee et al. |
| 6,888,755 | B2 | 5/2005 | Harari et al. |
| 6,894,930 | B2 | 5/2005 | Chien et al. |
| 6,897,522 | B2 | 5/2005 | Harari et al. |
| 6,903,434 | B2 | 6/2005 | Shrivastava |
| 6,921,688 | B2 | 7/2005 | Shrivastava |
| 6,925,007 | B2 | 8/2005 | Harari et al. |
| 6,936,887 | B2 | 8/2005 | Harari |
| 2002/0096704 | A1 | 7/2002 | Fukumoto |
| 2002/0190312 | A1 | 12/2002 | Lee |
| 2003/0001204 | A1 | 1/2003 | Kobayashi |
| 2003/0030089 | A1 | 2/2003 | Sumino et al. |
| 2003/0080370 | A1 | 5/2003 | Harari et al. |
| 2003/0143815 | A1 | 7/2003 | Shimizu |
| 2004/0099900 | A1 | 5/2004 | Tadashi |
| 2004/0212006 | A1 | 10/2004 | Harari |
| 2005/0072999 | A1 | 4/2005 | Matamis |
| 2005/0162927 | A1 | 7/2005 | Chien |
| 2005/0180186 | A1 | 8/2005 | Lutze et al. |
| 2005/0218445 | A1 | 10/2005 | VanDuuren |

FOREIGN PATENT DOCUMENTS

| | | |
|---|---|---|
| EP | 0509697 | 9/1999 |

OTHER PUBLICATIONS

Seiichi Aritome, "Advanced Flash Memory Technology and Trends for File Storage Application," 2000 International Electron Devices Meeting, Dec. 10-13, 2000, pp. 33.1.1-33.1.4.

Masataka Kato, et al., "A Shallow-Trench-Isolation Flash Memory Technology with a Source-Bias Programming Method," IEDM, 1996, pp. 177-180.

Office Action, Korean Intellectual Property Office (KIPO), Korean Patent Application No. 7011763/2007 filed on Nov. 3, 2005, Sep. 18, 2008.

SELF-ALIGNED TRENCHES WITH GROWN DIELECTRIC FOR HIGH COUPLING RATIO IN SEMICONDUCTOR DEVICES

CLAIM OF PRIORITY

This application is a divisional application of U.S. patent application Ser. No. 10/996,030, entitled "METHODS FOR SELF-ALIGNED TRENCH FILLING WITH GROWN DIELECTRIC FOR HIGH COUPLING RATIO IN SEMICONDUCTOR DEVICES," filed Nov. 23, 2004 now U.S. Pat No. 7,381,615 and incorporated herein by reference in its entirety.

BACKGROUND OF THE INVENTION

1. Field of the Invention

Embodiments of the present invention are directed to high density semiconductor devices, such as nonvolatile memory, and systems and methods for isolating active regions and components in high density semiconductor devices.

2. Description of the Related Art

Integrated circuits are constructed by electrically connecting multiple isolated devices that share a common substrate. When multiple devices are formed on or in a common substrate, it is necessary to isolate the individual devices using isolation technology. As the density of integrated circuits continues to increase, the space available for isolating devices tends to decrease. With decreased device dimensions, inter-device parasitic currents and charges can become more problematic, making isolation technology a critical component of integrated circuit fabrication.

For example, in nonvolatile semiconductor memory devices such as flash memory, many individual storage elements are constructed from a common substrate to form a memory array. These individual storage elements must be isolated from one another using isolation technology. In one example of a flash memory system, the NAND structure is used. The NAND structure includes multiple transistors arranged in series, sandwiched between two select gates. The transistors in series and the select gates are referred to as a NAND string. Isolation technologies are typically employed during the device fabrication process to provide electrical isolation between adjacent NAND strings sharing a common substrate.

Numerous techniques exist for isolating devices in NAND flash memory and other types of semiconductor devices. In Local Oxidation of Silicon (LOCOS) techniques, an oxide is grown or deposited on the surface of a substrate, followed by the deposition of a nitride layer over the oxide layer. After patterning these layers to expose the desired isolation areas and cover the desired active areas, a trench is etched into these layers and a portion of the substrate. An oxide is then grown on the exposed regions. The grown oxide typically grows under the deposited nitride causing the encroachment of oxide into the active regions (often referred to as a bird's beak). This encroachment can cause stresses and ultimately defects in the silicon. Furthermore, the encroachment decreases the available active area for constructing devices which limits the density that can be achieved in the integrated circuit. Additionally, the LOCOS technique can cause alignment issues since the trench is formed prior to forming layers such as the conductive layer used to fabricate the floating gate of a device. For example, the subsequently formed floating gate material may not properly align between two predefined trenches.

Improvements to these processes have been made by employing such techniques as sidewall-masked isolation (SWAMI) to decrease encroachment into active areas. In SWAMI, a nitride is formed on the trench walls prior to forming the oxide to decrease the oxide's encroachment and formation of bird's beaks. While this process provides an improvement to conventional LOCOS, the nitride in the trench rises during oxidation, causing encroachment into the active areas. This technique also yields excessive stress in the corners of the trench since oxide growth in that region is restrained. Moreover, the trenches are formed prior to device fabrication leading to the aforementioned alignment issues.

Accordingly, there is a need for isolation technology that can effectively isolate devices in high density semiconductor integrated circuits while addressing the shortcomings of the prior art identified above.

SUMMARY OF THE INVENTION

Self-aligned trench filling to isolate active regions in high-density integrated circuits is provided. A deep, narrow trench is etched into a substrate between active regions. The deep, narrow trench can form an effective isolation region between active regions without occupying as much lateral substrate area as required by other techniques such as shallow trench isolation. The trench is filled by growing a suitable dielectric such as silicon dioxide. The dielectric grows from the substrate to fill the trench and into the substrate to provide a dielectric of greater width and depth than the trench. Storage elements for a NAND type flash memory system, for example, can be fabricated by etching the substrate to form the trench after or as part of etching to form NAND string active areas. This technique stands in contrast to prior art techniques (e.g., LOCOS) where the trench is formed prior to device active areas such as a NAND string active area. This can ensure alignment of the NAND string active areas between isolation trenches. Because the dielectric growth process is self-limiting, an open area resulting from the etching process can be maintained between the stacks. A subsequently formed inter-gate dielectric layer and control gate layer can fill the open area to provide sidewall coupling between control gates and floating gates. In prior art techniques that employ deposition to fill trenches, the area between NAND string active areas is filled with the dielectric that is deposited for the trench such that the control gate only overlies the floating gate in a vertical direction. There can be no sidewall coupling in such prior art configurations.

In one embodiment, a method of fabricating a nonvolatile memory device is provided that includes forming a first dielectric layer above a substrate and forming a first conductive layer above the first dielectric layer. After forming these layers, the method continues by etching through the first conductive layer, the first dielectric layer, and at least a portion of the substrate to define a trench in the substrate between a first portion of the first conductive layer and a second portion of the conductive layer. The trench is filled by growing a dielectric material. The method then continues by forming a second dielectric layer above the first conductive layer and forming a second conductive layer above the second dielectric layer.

In another embodiment, a nonvolatile memory device is provided that includes a substrate, a first dielectric layer formed above the substrate, a first conductive layer having a first portion that is subdivided to form floating gates for a first group of storage elements of the integrated circuit and a second portion that is subdivided to form floating gates for a second group of storage elements of the integrated circuit, and a trench etched in the substrate between the first portion and the second portion of the first conductive layer. The trench is filled with a grown dielectric. The circuit further includes a second dielectric layer formed above the first portion and the second portion of the first conductive layer, and a second conductive layer formed above the second dielectric layer. The second conductive layer forms control gates for the first group of storage elements and the second group of storage elements. The second layer is subdivided to form word lines of the integrated circuit.

In another embodiment, a method of fabricating a nonvolatile memory is provided that includes forming an isolation trench in a substrate between a first NAND string active area and a second NAND string active area. The first NAND string active area and second NAND string active area each include a first dielectric portion and a first conductive portion. The first dielectric portion and the first conductive portion of the first NAND string active area and the second NAND string active area are formed prior to the isolation trench. The method further includes filling the trench with a grown dielectric material to isolate the first NAND string active area from the second NAND string active area.

Other features, aspects, and objects of the invention can be obtained from a review of the specification, the figures, and the claims.

DETAILED DESCRIPTION

Figure 1:
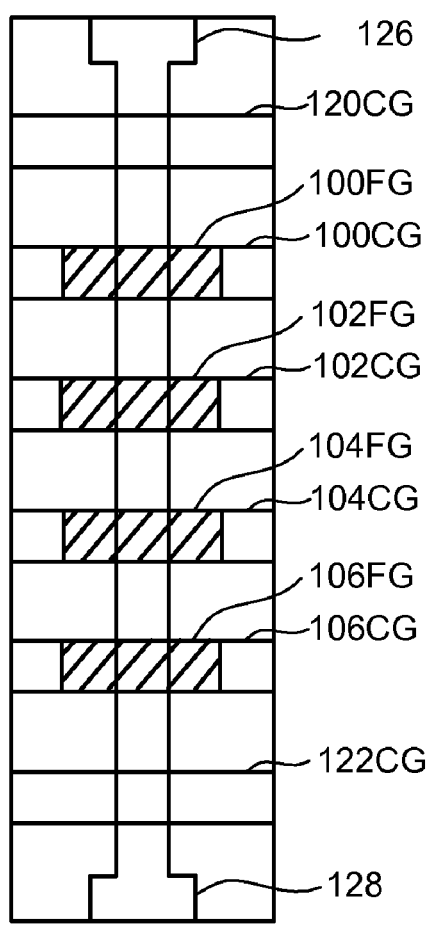
FIG. 1 is a top view of a NAND string.
Figure 2:
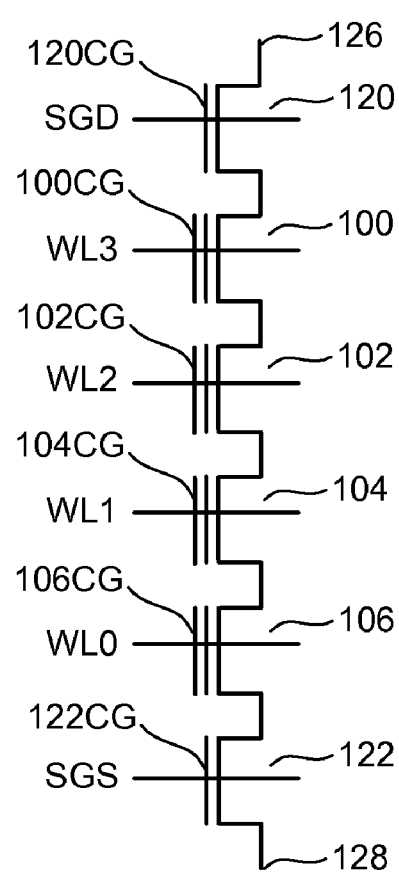
FIG. 2 is an equivalent circuit diagram of the NAND string depicted in FIG. 1.

FIG. 1 is a top view showing one NAND string. FIG. 2 is an equivalent circuit thereof. Trench isolation techniques in accordance with embodiments are presented with respect to nonvolatile flash memory and NAND type memory for purposes of explanation. It will be appreciated by those of ordinary skill in the art, however, that the techniques set forth are not so limited and can be utilized in many fabrication processes to fabricate various types of integrated circuits.

The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128.

Each of the transistors 100, 102, 104 and 106 includes a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc.

Figure 3:
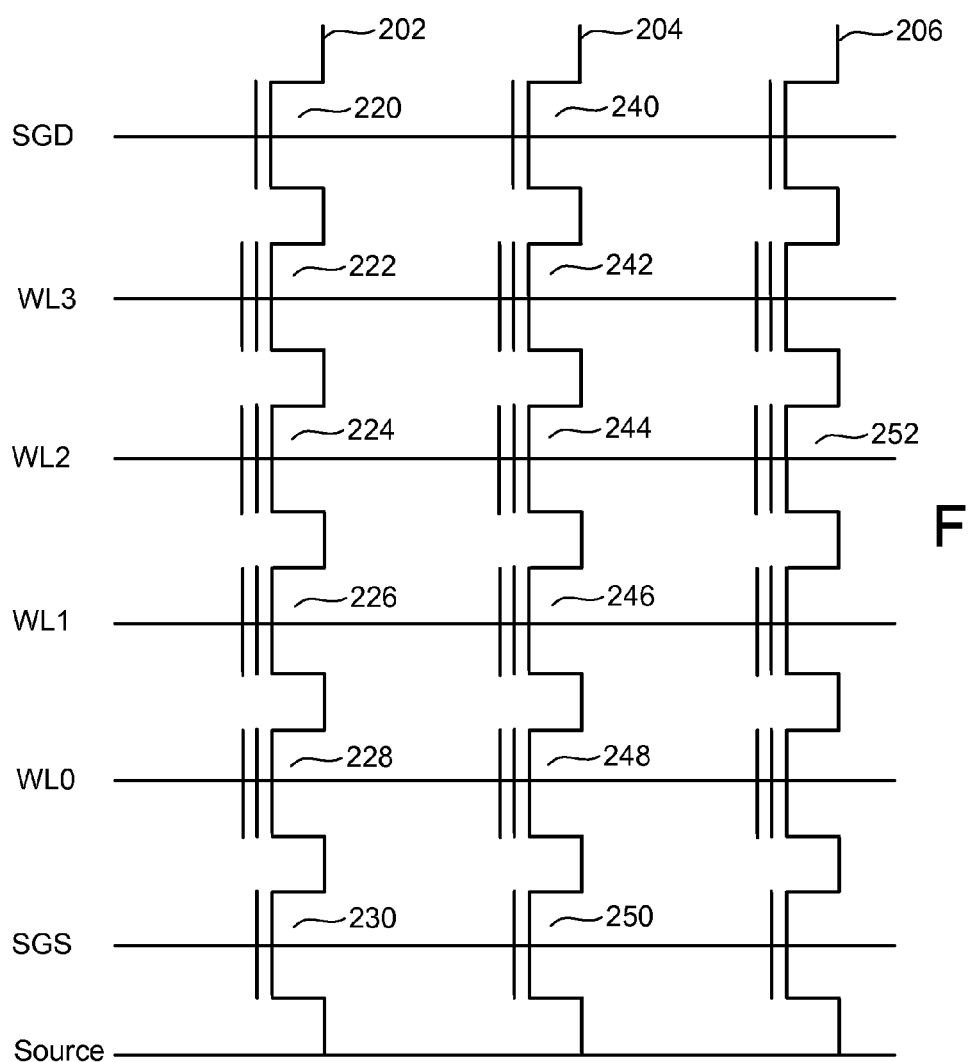
FIG. 3 is a circuit diagram depicting three NAND strings.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors and four memory cells. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. Each word line (WL3, WL2, WL1 and WL0) is connected to the control gate of one memory cell on each NAND string forming a row of cells. For example, word line WL2 is connected to the control gates for memory cell 224, 244, and 252. As can be seen, each bit line and the respective NAND string comprise the columns of the array of memory cells. In NAND structures, it is necessary to isolate the individual NAND strings and associated storage elements from one another using isolation technology.

Figure 4:
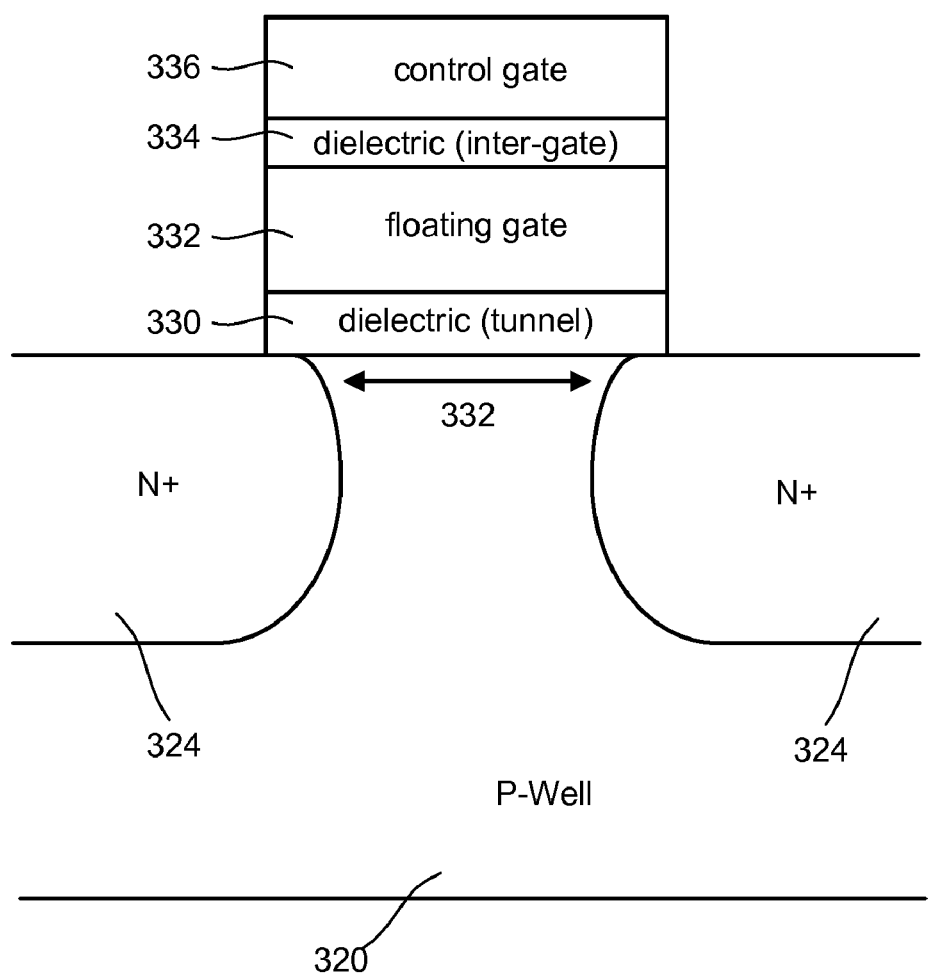
FIG. 4 is a two-dimensional block diagram of one embodiment of a flash memory cell that can be fabricated in accordance with one embodiment.

FIG. 4 is a two-dimensional block diagram of one embodiment of a flash memory cell such as those depicted in FIGS. 1-3 that can be fabricated in accordance with embodiments. The memory cell of FIG. 4 includes a triple well comprising a P-substrate, an N-well, and a P-well. The P-substrate and the N-well are not depicted in FIG. 4 in order to simplify the drawing. Within P-well 320, are N+ doped regions 324, which serve as source/drain regions for the memory cell. Whether N+ doped regions 324 are labeled as source regions or drain regions is somewhat arbitrary. Therefore, the N+ doped source/drain regions 324 can be thought of as source regions, drain regions, or both.

Between N+ doped regions 324 is a channel 322. Above channel 322 is a first dielectric area or layer 330. Above dielectric layer 330 is a conductive area or layer 332 that forms a floating gate of the memory cell. The floating gate, under low-voltage operating conditions associated with read or bypass operations, is electrically insulated/isolated from channel 322 by the first dielectric layer 330. Above floating gate 332 is a second dielectric area or layer 334. Above dielectric layer 334 is a second conductive layer 336 that forms a control gate of the memory cell. In other embodiments, various layers may be interspersed within or added to the illustrated layers. For example, additional layers can be placed above control gate 336, such as a hard mask. Together, dielectric 330, floating gate 332, dielectric 332, and control gate 336 comprise a stack. An array of memory cells will have many such stacks.

When programming in tunneling-based, electrically erasable programmable read-only memory (EEPROM) or flash memory devices, a program voltage is typically applied to the control gate and the bit line is grounded. Electrons from the channel are injected into the floating gate as electrons tunnel across dielectric 330. Dielectric 330 is often referred to as a tunnel dielectric or tunnel oxide. When electrons accumulate in floating gate 332, the floating gate becomes negatively charged, and the threshold voltage of the memory cell is raised to one of the threshold voltage distributions pre-defined to represent the storage of one or more bits of data. Typically, the program voltage applied to the control gate is applied as a series of pulses. The magnitude of the pulses is increased with each successive pulse by a pre-determined step size.

Figure 5:
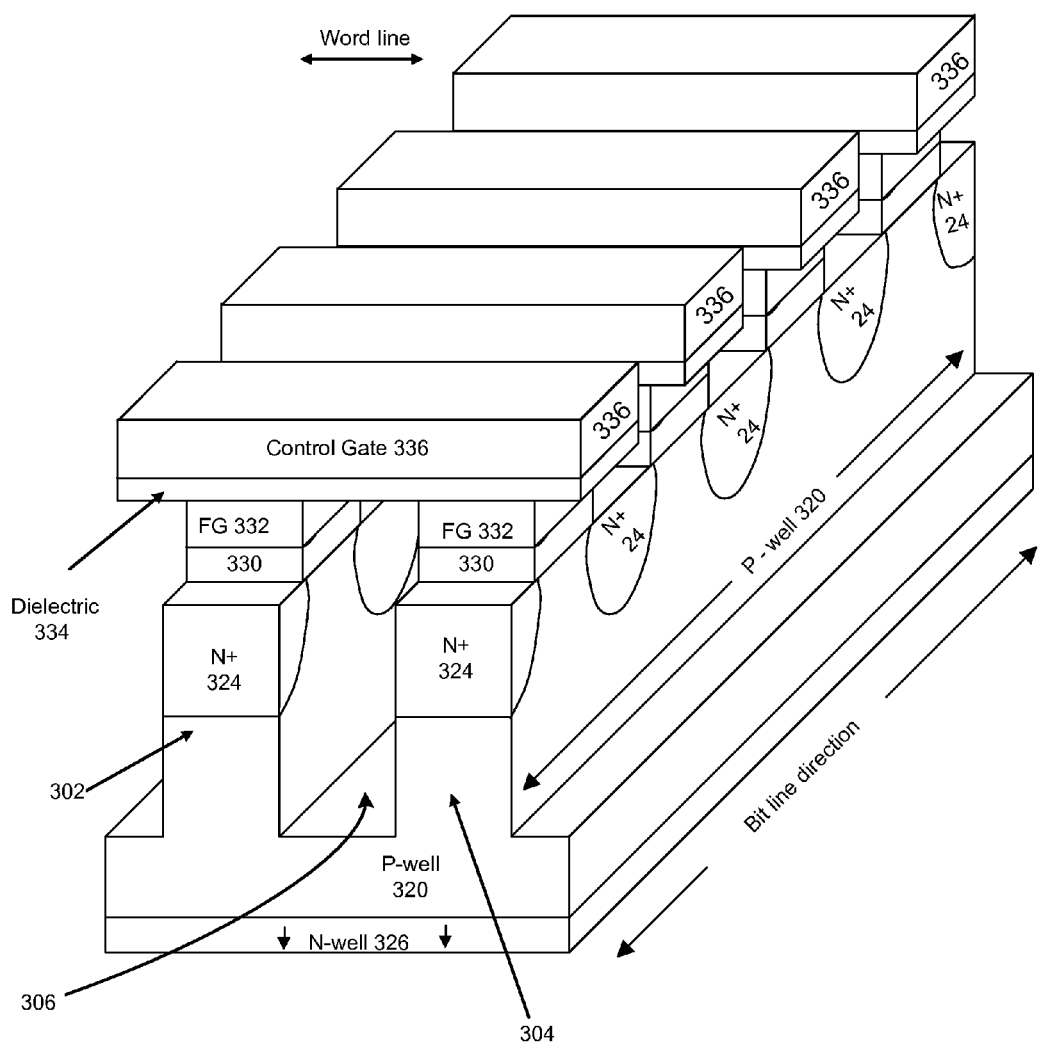
FIG. 5 is a three dimensional drawing of a pair of four word line long portions of two NAND strings that can be fabricated in accordance with one embodiment.

As previously described, when constructing semiconductor-based integrated circuits, it is necessary to provide isolation between individual devices. In the example of flash memory, it is necessary to electrically isolate select memory cells, such as that depicted in FIG. 4, from other memory cells of the storage array. FIG. 5 is a three-dimensional block diagram of two typical NAND strings 302 and 304 that may be fabricated as part of a larger flash memory array. FIG. 5 depicts four memory cells on strings 302 and 304. However, more or less than four memory cells can be used. Each of the memory cells of the NAND string has a stack as described above with respect to FIG. 4. FIG. 5 further depicts N-well 326 below P-well 320, the bit line direction along the NAND string, and the word line direction perpendicular to the NAND string. The P-type substrate below N-well 336 is not shown in FIG. 5. In one embodiment, the control gates form the word lines. A continuous layer of conductive layer 336 is formed which is consistent across a word line in order to provide a common word line or control gate for each device on that word line.

When fabricating a NAND-based non-volatile memory system, including NAND strings as depicted in FIG. 5, it is necessary to provide electrical isolation between adjacent strings. For example, NAND string 302 must be electrically isolated from NAND string 304 in order to provide discreet devices with independent electrical characteristics. Isolation of the memory cells on NAND string 302 from the memory cells on NAND string 304 is typically accomplished by providing an electrical barrier between the strings in order to inhibit or prevent parasitic currents and charges between adjacent memory cells.

In the embodiment depicted in FIG. 5, NAND string 302 is separated from NAND string 304 by an open area or void 306. In typical NAND configurations, a dielectric material is formed between adjacent NAND strings and would be present at the position of open area 306. As previously described, many prior art techniques include forming a dielectric isolation region prior to forming the stacks for each memory cell using a LOCOS process, for example.

The ability to provide electrical isolation is often measured in terms of a field threshold. The field threshold represents the amount of charge or current that a particular isolation technique can withstand. For example, an isolation region may provide a 10 volt field threshold such that it can withstand a charge of 10 volts placed across it. In many modern non-volatile flash memory devices, the charge levels within the circuit are continuing to increase. As device dimensions decrease, the influence of a floating gate over the channel region can decrease. To properly program non-volatile flash memory devices having such small dimensions, high program voltages are applied to the control gates. For example, in many non-volatile flash memory devices, a program voltage of 20 volts or more can be applied. Accordingly, it necessary to provide a field threshold level between NAND strings, equal to or greater than the maximum expected voltage level present in the device. In addition to higher charge levels within devices, the decrease in device dimensions makes it more difficult to provide electrical isolation between devices, given the smaller amount of area within which to isolate the devices. Looking at FIG. 5, as NAND strings 302 and 304 are progressively fabricated closer and closer together, it is more difficult to provide an effective isolation therebetween.

FIGS. 6A through 6H depict a sequential process for forming isolation regions between active areas in an integrated circuit in accordance with one embodiment. FIG. 7 is a flow chart depicting a process for forming isolation regions during the fabrication of non-volatile memory devices such as that depicted in FIGS. 6A-6H. FIGS. 6A-6H and FIG. 7 depict a specific example with respect to a NAND flash memory device. However, it will be appreciated by those of ordinary skill in the art that the techniques described herein are easily extendible to many types of semiconductor devices and can be incorporated with many numerous types of fabrication processes. In FIGS. 6A-6H, the bit line direction, relative to the page, runs in and out of the page while the word line direction runs left to right relative to the page.

Figure 6A:
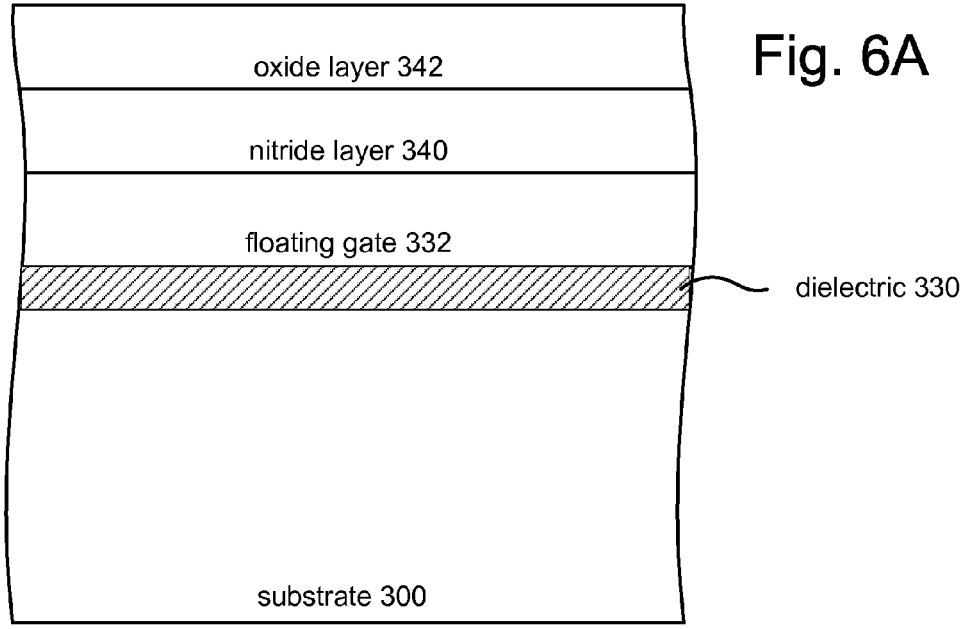
FIGS. 6A-6H depict NAND string stacks in accordance with one embodiment at various stages of a fabrication process in accordance with one embodiment.
Figure 7:
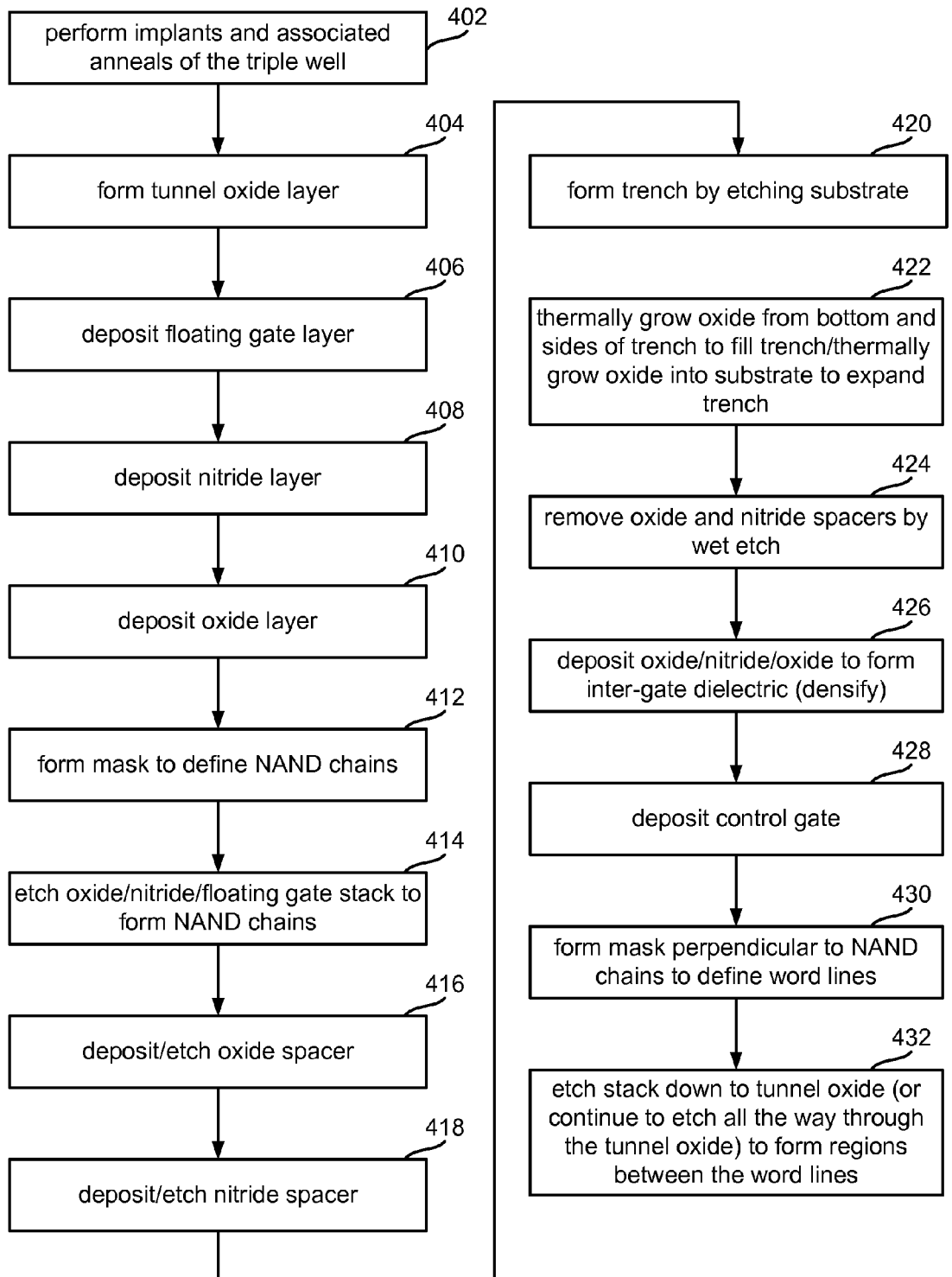
FIG. 7 is flowchart of a method of fabricating flash memory cells in accordance with one embodiment.

FIG. 6A depicts a substrate 300 on and in which multiple non-volatile NAND-type flash memory devices are to be fabricated. Substrate 300 is used generically to represent a substrate, but can also include P-wells and/or N-wells formed therein, as appropriate for various implementations. For example, a P-well and N-well may be formed in substrate 300 as depicted in FIGS. 4 and 5.

At step 402 of FIG. 7, implanting and associated annealing of a triple well including substrate 300 is performed. After implanting and annealing the triple well, a dielectric layer 330 is formed above substrate 300 at step 404. Dielectric 330 can form the tunnel oxide of storage elements. Dielectric layer 330 can include an oxide or other suitable dielectric material in various embodiments. Dielectric layer 330 can be deposited using known chemical vapor deposition (CVD) processes, metal organic CVD processes, physical vapor deposition (PVD) processes, atomic layer deposition (ALD) processes, grown using a thermal oxidation process, or formed using another suitable process. In one embodiment, dielectric 330 is about 70-100 angstroms in thickness. However, thicker or thinner layers can be used in accordance with various embodiments. Additionally (and optionally), other materials may be deposited on, deposited under, or incorporated within the dielectric to form dielectric layer 330.

At step 406, a first conductive layer 332 (e.g., polysilicon) is deposited on top of the tunnel oxide layer. First conductive layer 332 will comprise the floating gates for the memory devices of the strings being fabricated. In one embodiment, conductive layer 332 is polysilicon deposited using known processes as described above. In other embodiments, other conductive materials can be used. In one embodiment, conductive layer 332 is about 500 angstroms in thickness. However, conductive layers thicker or thinner than 500 angstroms can be used in accordance with embodiments.

After depositing the floating gate layer, a nitride layer 340 is deposited at step 408 and an oxide layer 342 deposited at step 410. These oxide and nitride layers serve as sacrificial layers for various later-performed steps. Both the oxide and nitride layers can be formed using known processes, and each layer can be about 400 angstroms in thickness. However the thickness of each of these layers can be more or less than 400 angstroms in accordance with various embodiments. Layers 330, 332, 340, and 342 are preliminary NAND string active area layers that are used to form a plurality of devices. Multiple NAND strings will be constructed using these layers as starting layers.

After layers 330, 332, 340, and 342 have been formed, a hard mask can be deposited (step 412) over oxide layer 342 to begin the process of defining the individual NAND strings of the device. After depositing a hard mask over the oxide layer, photolithography can be used to form strips of photoresist over the areas to become the NAND strings. After forming the strips of photoresist, the exposed mask layers can be etched using anisotropic plasma etching, for example.

Figure 6B:
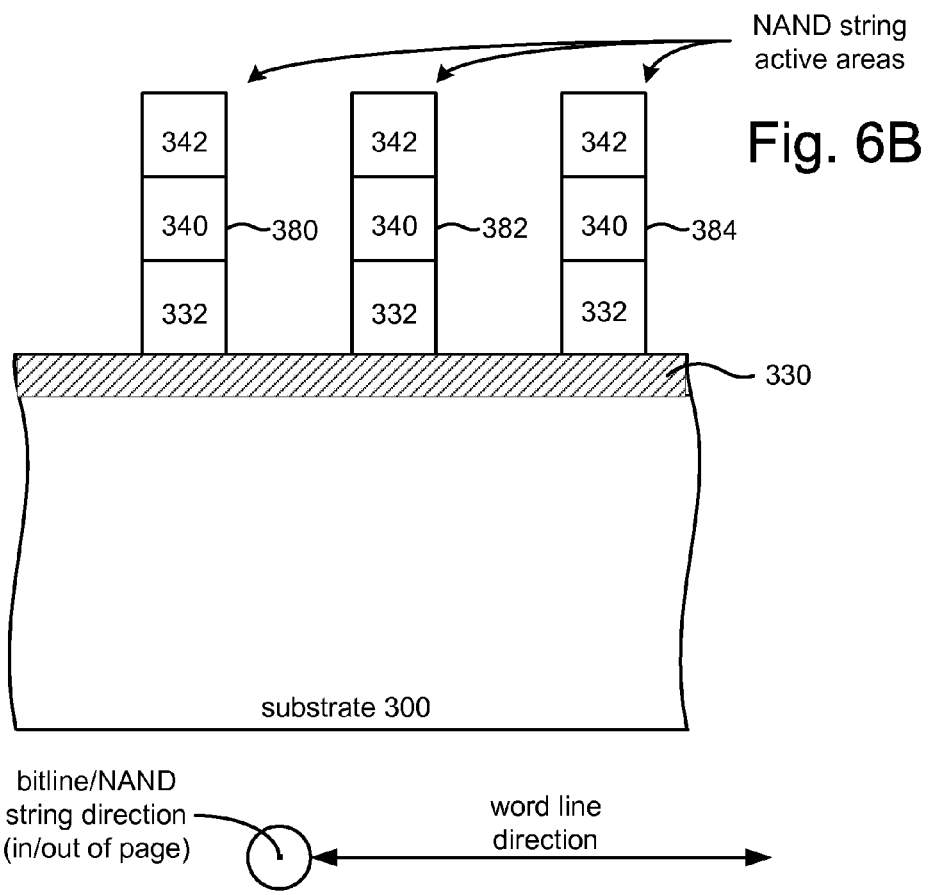

At step 414, the oxide layer, nitride layer, and floating gate layer are etched using the photoresist and mask to form the individual NAND string active areas 380, 382, and 384. The result of such a process is depicted in FIG. 6B. FIG. 6B depicts floating gate layer 332, nitride layer 340, and oxide layer 342, after etching to form three distinct preliminary NAND string active areas that will become individual NAND strings for the memory device. The three NAND string active areas are adjacent to one another in the word line direction.

Figure 6C:
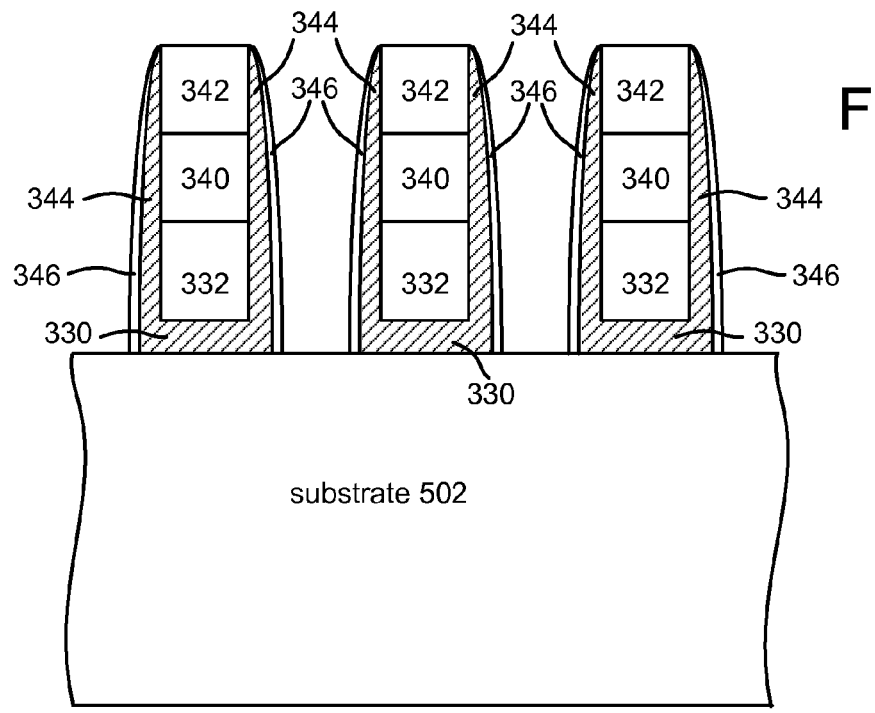

After defining the NAND string active areas, a layer of oxide is deposited on the exposed surfaces (step 416) to begin formation of sidewall spacers for each defined string. After depositing the oxide, it is etched back from substrate 300 to form first sidewall spacer layers 344 for each NAND string. Dielectric 330 is also etched to expose those areas of substrate 300 outside the spacer and in between the preliminary active areas. FIG. 6C depicts oxide spacer layers 344 after having been deposited and etched.

After depositing and etching oxide spacer layers 344, a layer of nitride is similarly deposited and etched (step 418) to form second sidewall spacer layers 346. FIG. 6C further illustrates the stacks after deposition and etching to form nitride spacer layers 346. Together, layers 344 and 346 form a sidewall spacer on each sidewall of each NAND string stack. The sidewall spacers serve as a mask for the trench etching steps to follow in order to narrow the width of the trenches that will be formed between adjacent NAND strings in the memory device. For example, the sidewall spacer on NAND string active area 380 and the adjacent sidewall spacer on NAND string active area 382 will be used to define a trench between active areas 380 and 382.

Figure 6D:
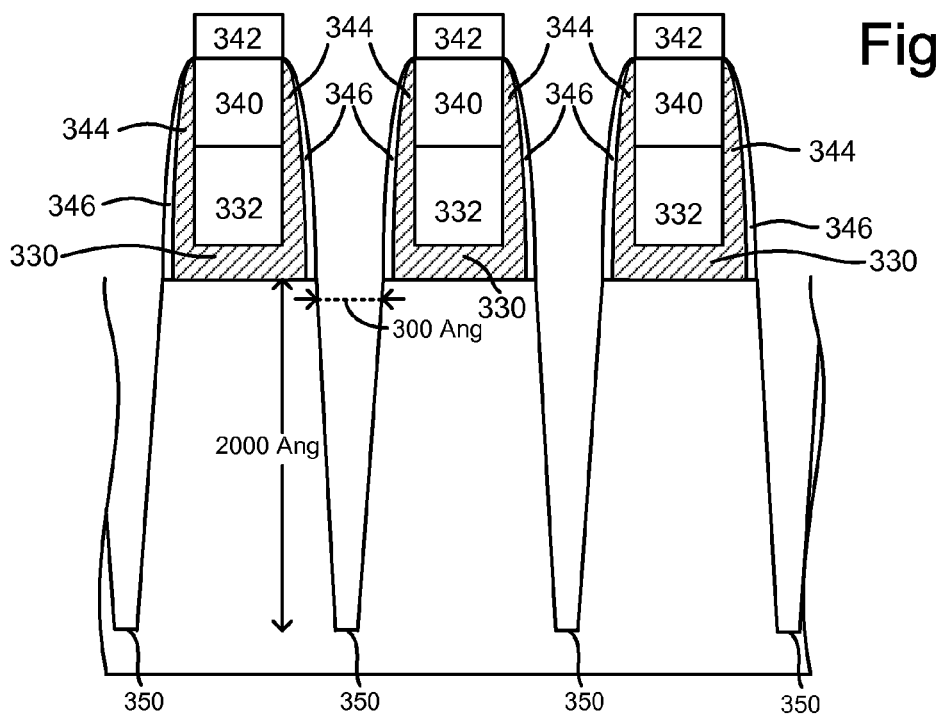

After forming the sidewall spacers, a narrow deep trench is etched (step 420) into substrate 300 to begin the formation of isolation regions between adjacent NAND strings. FIG. 6D depicts the substrate after etching to form trenches 350. Trenches 350 are etched between adjacent NAND string active areas. The trench has slanted walls which become narrower towards the bottom of the trench. Because of the formation of sidewall spacers (layers 344 and 346) prior to etching, the width of the trench can be narrow in comparison to trenches formed using prior art techniques. In one embodiment, trenches 230 are about 2,000 angstroms deep and about 300 angstroms in width at the top. However, it will be understood by those of ordinary skill in the art, that devices of other dimensions can also be constructed in accordance with various embodiments. As illustrated in FIG. 6D, oxide layer 342 serves as a sacrificial layer for the etching process. The thickness of oxide layer 342 is decreased during the etching process.

The formation of narrow trenches can enable decreases in overall device dimension sizes by facilitating closer spacing of NAND strings. Because a very deep trench is used, a high field threshold can be obtained, while still maintaining a narrow trench width. The amount of field threshold accomplished by an isolation region using a trench, as depicted in FIGS. 6A through 6H, is dependant upon the aspect ratio defined by the width/height ratio of the trench. In accordance with embodiments, a deep, narrow trench is used in order to decrease device dimension size, while also maintaining a suitable aspect ratio. Thus, a high field threshold can be maintained while decreasing device dimensions. The use of sidewall spacers (layers 344 and 346) enables a narrow trench to be formed, while also serving as a mask, as previously described. The oxide and nitride layers will serve to constrict the etching to between the adjacent nitride spacer layers. The top of the trench will be narrower than the space between adjacent NAND-strings by an amount equal to twice the width of each oxide spacer layer and each nitride spacer layer.

It should be noted that the formation of floating gate layer 332 prior to etching trenches 350 avoids mis-alignment issues that may exist in prior art techniques that form an isolation region prior to forming a floating gate layer. Because the floating gate layer is formed first and etched along with the substrate to form a trench, the trench will be properly aligned between the floating gates of memory cells on adjacent NAND strings. In prior art techniques where the trench is formed first, care must be taken to properly form the floating gate layer between predefined isolation regions. The imprecision of growth and deposition processes may cause the floating gate to not be properly positioned between the isolation regions. Such is not the case in accordance with embodiments herein because the floating gate is accurately positioned in between the trenches due to etching after forming the floating gate.

After forming trenches 350, the trenches are filled by thermally growing (and/or depositing) an oxide or other suitable dielectric material (e.g., nitride) from the bottom and sides of the trench to substantially fill the trench with a grown oxide (step 422). The trench can be filled using known thermal growth techniques for growing oxides from a silicon substrate. For example, exposing the silicon substrate to an oxygen containing mixture will cause oxidation of the silicon, and the formation of silicon-dioxide within the trench. The silicon-dioxide will grow from both the bottom of the trench and each of the sidewalls of the trench. This growth process is self-limiting. The trench will initially fill from the bottom due to its narrower width at that portion, and gradually fill from the bottom and the sides as the oxide is grown. This allows the process to be self-limiting. As the trench is filled from the bottom and sides, the subsequent growth will be concentrated and fastest at the unfilled exposed areas. Accordingly, uniform growth of the trench filling oxide can be expected. In one embodiment, step 422 can include a combination of chemical vapor deposition and oxide growth. For example, a small thin layer of oxide can be deposited along the sidewalls and bottom of the trench in order to form a cushion between the silicon substrate and subsequently grown oxide. After forming this thin layer along the walls and bottom of the trench, an oxide can be grown to completely fill the trench as previously described.

Because of the shape of the trench and the use of a self-limiting growth process, there will be no keyhole void (hole in the oxide) near the bottom of the trench as is common when trenches are filled using deposition processes. Because the oxide will grow and fill the trench from the bottom first, no void will be created due to disproportionate oxide deposition at the top of the trench, as in prior art process.

Figure 6E:
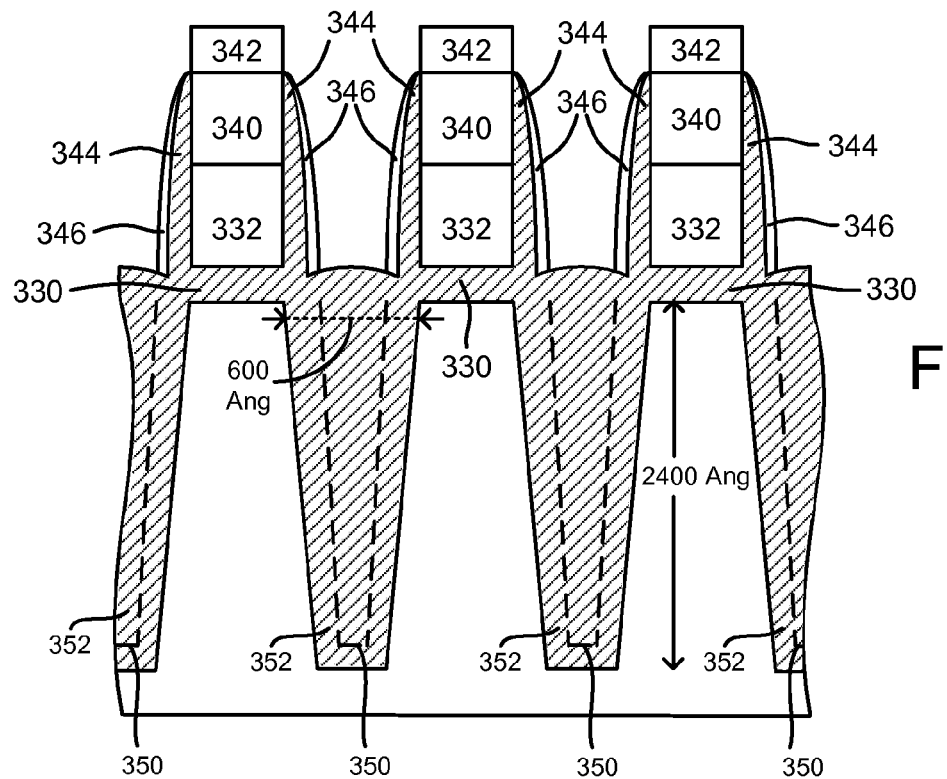

FIG. 6E illustrates the result of thermally growing oxide 352 in trenches 350. Oxide 352 has filled each of trenches 350 and extends beyond the top of the trench, to about the level of the bottom of the first conductive layer 330. It is noted that the resulting width and depth of the silicon dioxide is wider and deeper than the originally etched trenches 350. The resulting width and depth is due to the silicon dioxide not only growing from the sidewalls and the bottom of the trench into the trench, but also from the silicon dioxide growing from the sidewalls and the bottom of the trench into substrate 300 itself. As illustrated, this results in an oxide that is wider and deeper than the initial trench etched into the substrate. For example, the width of oxide at the top of each trench extends to encompass substantially all of the space between adjacent NAND string active areas. In one embodiment where a 300 angstrom width is etched to define the top of the trench as depicted in FIG. 6D, the effective oxide width at the top of the trench can reach about 600 angstroms after growing an oxide. Additionally, the 2000 angstrom depth of the trench can be extended by oxide growth to about 2200 angstroms.

Figure 6F:
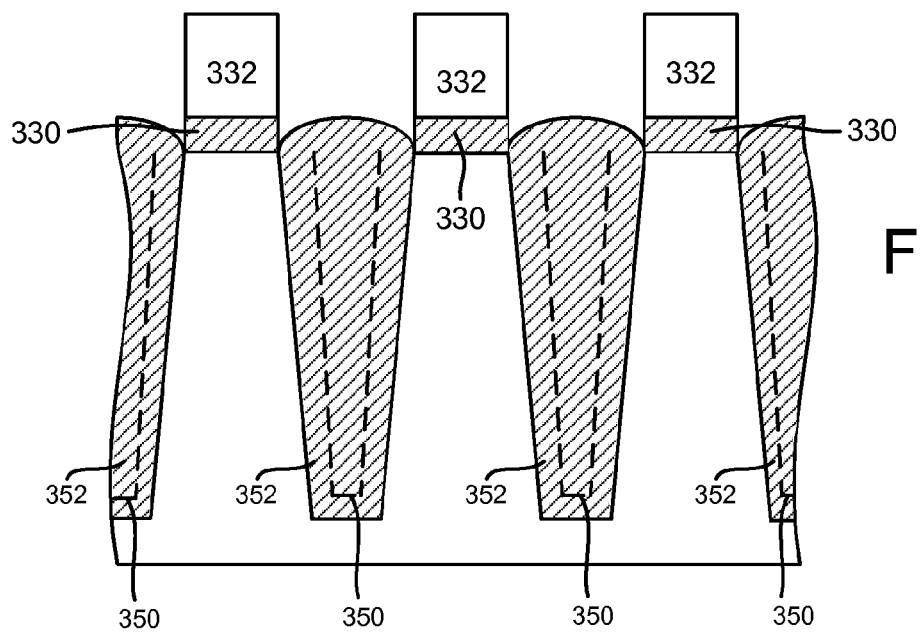

After forming and filling isolation trenches 350 with a grown oxide, a wet etch process is used (step 424) to remove nitride layer 340, any remaining portion of oxide layer 342, and the side wall spacers formed of oxide layer 344 and nitride layer 346. Step 424 exposes the tops and sides of the floating gate layers of each NAND string active area, as depicted in FIG. 6F.

Figure 6G:
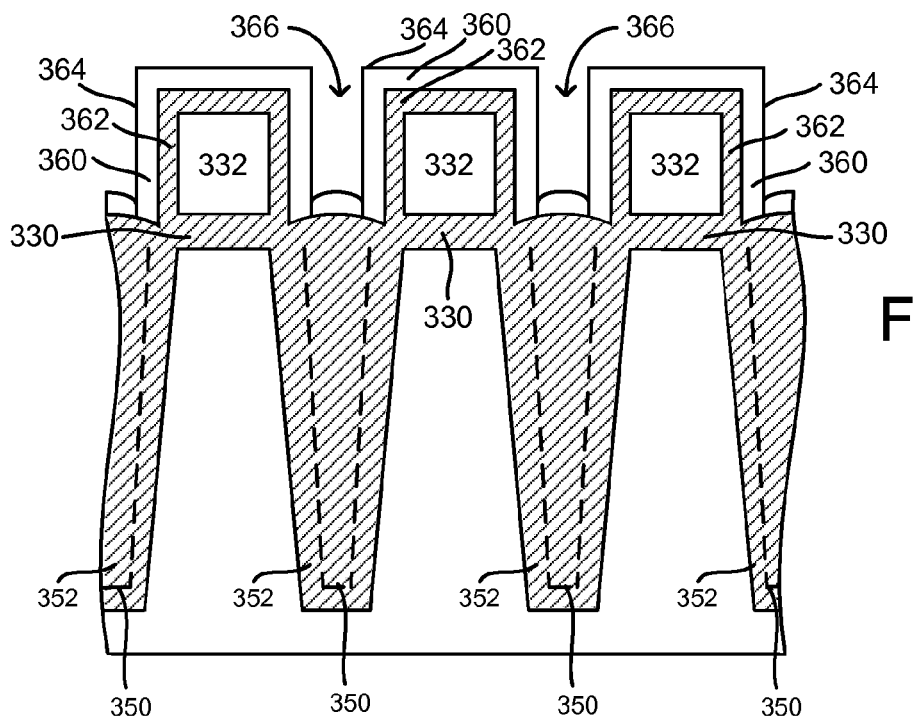

After exposing floating gate layer 332, a second dielectric layer is formed above and in between the etched portions of floating gate layer 332 at step 426. The second dielectric layer forms the inter-gate dielectric for the individual storage devices of each string. In accordance with one embodiment, the second dielectric layer is formed of multiple individual layers of dielectric material. As depicted in FIG. 6G for example, the dielectric layer can be formed of a first layer of oxide 362, a second layer of nitride 360, and a third layer of oxide 364 (oxide layer 364 is depicted on the outside of nitride layer 364, but without any substantial thickness shown in the figure.) A dielectric comprised of oxygen/nitrogen/oxygen layers is often referred to as an ONO dielectric. The total depth of the second dielectric layer can be about 290 angstroms. For example, oxide layer 362 can be about 120 angstroms, nitride layer 360 about 120 angstroms, and the second oxide layer 364 about 50 angstroms. In other embodiments the second dielectric layer can be greater or less than 290 angstroms and the individual layers can be greater than or less than the specified dimensions and be formed of alternate materials. In one embodiment, the dielectric layer is formed by depositing each of the oxide and nitride layers using processes such as chemical vapor deposition. The dielectric layer can be densified using known densification techniques. The combination of a 120 angstrom oxide, a 120 angstrom nitride, and a 50 angstrom oxide layer has an effective ONO thickness of about 140 angstroms.

Figure 6H:
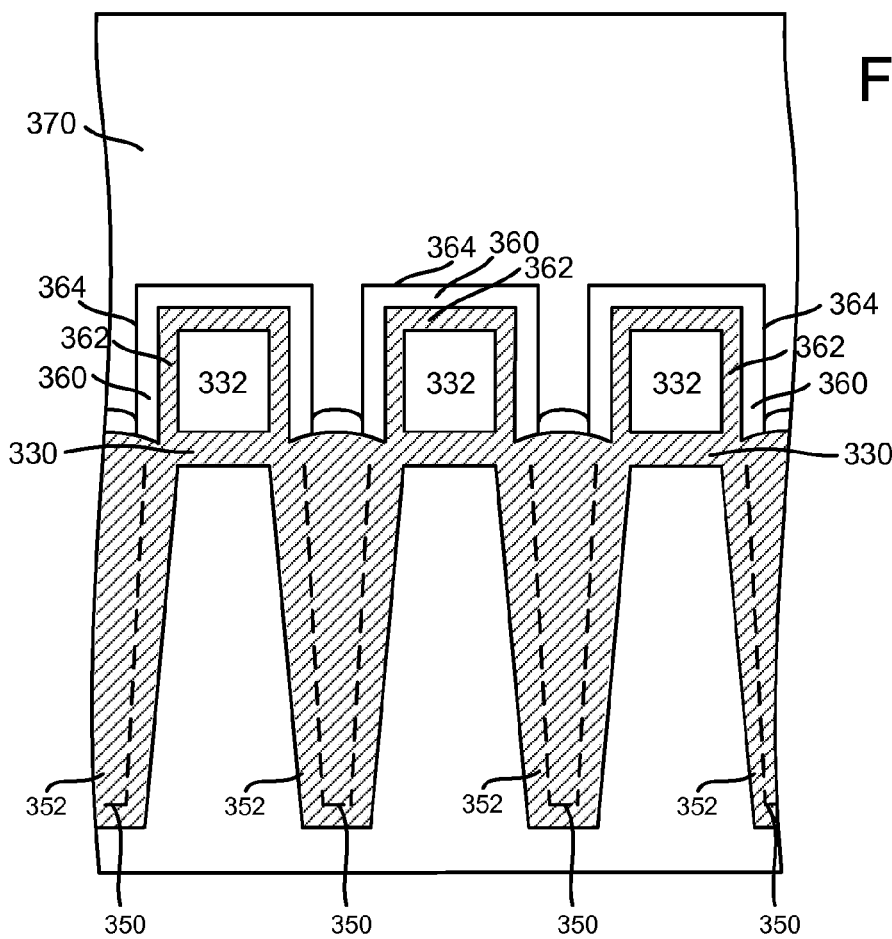

After forming the second dielectric layer, a second conductive layer 370 is deposited over the exposed regions of the structure at step 428. In one embodiment, conductive layer 370 is poly-silicon and forms the control gates for multiple non-volatile memory cells. In one embodiment, poly-silicon layer 370 is deposited to a depth of about 2000 angstroms from the top of the second dielectric layer. As illustrated in FIG. 6H, poly-silicon layer 370 is not only deposited above dielectric layer 370, but also in between adjacent NAND string active areas to fill the areas 366 between the floating gates of each NAND string. For example, poly-silicon layer 370 will fill the area between NAND string active area 380 and NAND string active area 382. The control gate layer will surround the floating gate layer (and be separated from the control gate layer by the second dielectric layer) on three sides—the top and both sidewalls of the floating gate. The resulting coupling force from the control gate to the floating gate will include three coupling components. A first component results from coupling between a bottom portion of the control gate layer and the top portion of floating gate layer. A second and third component result from coupling between sidewall portions of the control gate layer and the two sidewalls of the floating gate of the stack.

Because the first floating gate layer is deposited prior to forming the trench, the floating gates will be aligned between two trenches as previously described. By virtue of this, the second dielectric layer is self-aligned over each floating gate and thus provides consistent coupling at each formed cell. Since etching occurs through the floating gate layer and into the substrate to form the trench, consistent spacing and alignment of floating gates is achieved. Accordingly, the control gate layer will be consistently formed around each floating gate which leads to consistent coupling characteristics for each device. In prior art techniques where the floating gate layers are mis-aligned, the subsequently formed control gate layer may not be consistently formed around each floating gate. This can lead to different coupling characteristics between cells.

At this point, it is useful to note a few additional characteristics accomplished by using the trench isolation technique in accordance with embodiments. As illustrated in FIG. 6G, a gap 366 exists between each of the NAND string active areas after formation of the second dielectric layer. In prior art processes using chemical vapor deposition to fill trenches, the oxide will not only be deposited into the trench, but will also be deposited over any other exposed layers. For example, if floating gate layer 332 is deposited prior to filling the trenches with a chemically deposited oxide into the trench, the oxide will not only fill the trench as depicted in FIGS. 6E and 6F, but will also extend above the top of the trench and over each of the floating gate layers 332. The oxide will fill the gap areas such as areas 366 depicted in FIG. 6G. These processes use a chemical mechanical polishing (CMP) process to planarize the deposited oxide and etch it (and any other materials) back to at least the height of the floating gate layer 332. Chemical mechanical polishing processes are not capable of selectively etching between the stacks. Accordingly, the top of the oxide will be commensurate and level with the top of the floating gate layer 332. Accordingly, no gap is able to be created between the NAND strings, as depicted in FIG. 6G. The subsequent deposition of a second dielectric layer (e.g., layers 360, 362, and 364), will only deposit such a dielectric layer on top of the floating gate layers. Accordingly, the subsequently deposited control gate layer will only extend above the floating gates, and not in between the floating gates, as depicted in FIG. 6H. Since the influence of a control gate over a respective floating gate is governed by the opposing surface areas of each of the layers, this limits the achievable coupling ratio. The coupling forces from the control gate to the floating gate will only extend in one direction—from the bottom of the control gate layer to the top of the floating gate layer. Thus, the coupling ratio in such scenarios is only proportional to the bottom surface area of the control gate and top surface area of the floating gate. The coupling ratio will not be effected by or benefit from the thickness (top to bottom relative to paper) of the floating gate layer.

However, in embodiments as depicted in FIG. 6H, the poly-silicon layer is deposited both above the floating gate layer, as well as in between adjacent portions of the floating gate layer. Thus, the control of the control gate over the floating gate is governed by the top surface area of the top of the floating gate due to top to bottom coupling and also by the thickness of poly-silicon layer 370 due to sidewall coupling.

For example, if each portion of floating gate layer 332 after etching has a width of $\lambda$ and thickness T, the coupling achieved in prior art techniques where the control gate only overlies the floating gate in a vertical direction is equal to some constant multiplied by $\lambda$. If, however, techniques in accordance with embodiments are used such that the control gate layer is not only formed above the floating gate layer, but also between individual NAND string active areas as depicted in FIG. 6H, the coupling is enhanced by sidewall coupling. The sidewall coupling is also equal to the same constant multiplied by the thickness T. Since there will be coupling from two sides, the total sidewall coupling is equal to the constant multiplied by 2T. Since the overall coupling is equal to the sidewall and top coupling values, the overall coupling ratio is equal to the constant multiplied by λ+2T, rather than just λ as in prior art techniques.

After depositing control gate layer 370, the active areas can be subdivided to form word lines that are isolated from one another. At step 430, a mask layer can be deposited on control gate layer 370 and photolithography used to form strips of photoresist perpendicular to the NAND string (formed in the word line direction). At step 432, the exposed portions of the mask and underlying layers can be etched using plasma etching, ion milling, ion etching that is purely physical etching, or another suitable process to etch the various layers and form the individual word lines by subdividing the control gate layer, the inter-gate dielectric layer, and the floating gate layers. The etched portions of the control gate layer form the individual word lines. In one embodiment, etching is performed until the tunnel dielectric layer is reached. In another embodiment, etching continues through the tunnel dielectric until the substrate is reached.

Figure 8:
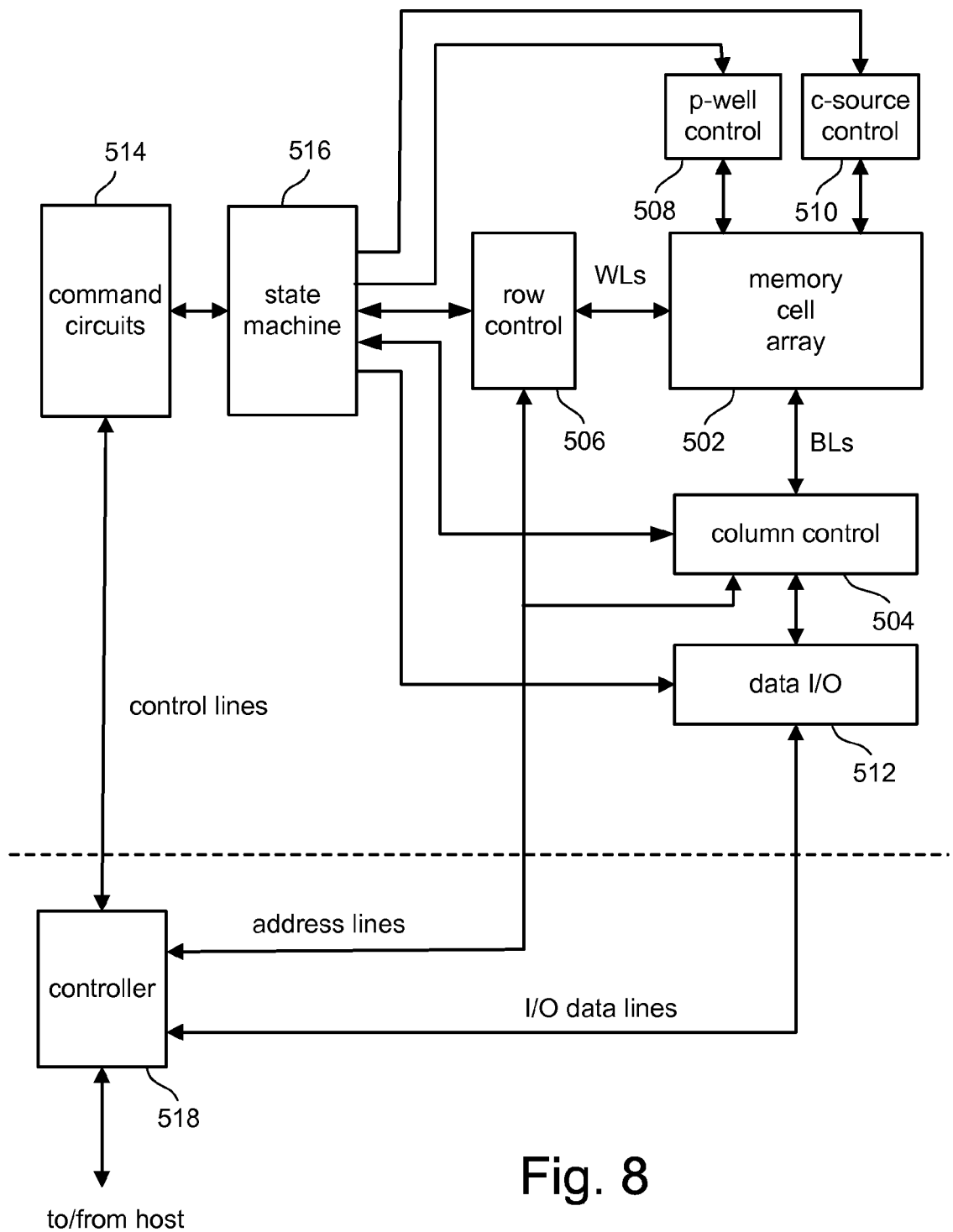
FIG. 8 is a block diagram of one example of a memory system that can be used to implement the present invention.

FIG. 8 is a block diagram of one embodiment of a flash memory system that can be used to implement the present invention. Memory cell array 502 is controlled by column control circuit 504, row control circuit 506, c-source control circuit 510 and p-well control circuit 508. Array 502 can include one or more memory cells fabricated according to embodiments set forth in FIGS. 6 and 7. Column control circuit 504 is connected to the bit lines of memory cell array 502 for reading data stored in the memory cells, for determining a state of the memory cells during a program operation, and for controlling potential levels of the bit lines to promote or inhibit programming and erasing. Row control circuit 506 is connected to the word lines to select one of the word lines, to apply read voltages, to apply program voltages combined with the bit line potential levels controlled by column control circuit 504, and to apply an erase voltage. C-source control circuit 510 controls a common source line (labeled as "C-source" in FIG. 6) connected to the memory cells. P-well control circuit 508 controls the p-well voltage.

The data stored in the memory cells are read out by the column control circuit 504 and are output to external I/O lines via data input/output buffer 512. Program data to be stored in the memory cells are input to the data input/output buffer 512 via the external I/O lines, and transferred to the column control circuit 504. The external I/O lines are connected to controller 518.

Command data for controlling the flash memory device are input to controller 518. The command data informs the flash memory of what operation is requested. The input command is transferred to state machine 516 that controls column control circuit 504, row control circuit 506, c-source control 510, p-well control circuit 508 and data input/output buffer 512. State machine 516 can also output status data of the flash memory such as READY/BUSY or PASS/FAIL.

Controller 518 is connected to or connectable with a host system such as a personal computer, a digital camera, or personal digital assistant, etc. It communicates with the host that initiates commands, such as to store or read data to or from the memory array 502, and provides or receives such data. Controller 518 converts such commands into command signals that can be interpreted and executed by command circuits 514, which is in communication with state machine 516. Controller 518 typically contains buffer memory for the user data being written to or read from the memory array.

One exemplary memory system comprises one integrated circuit that includes controller 518, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Figure 9:
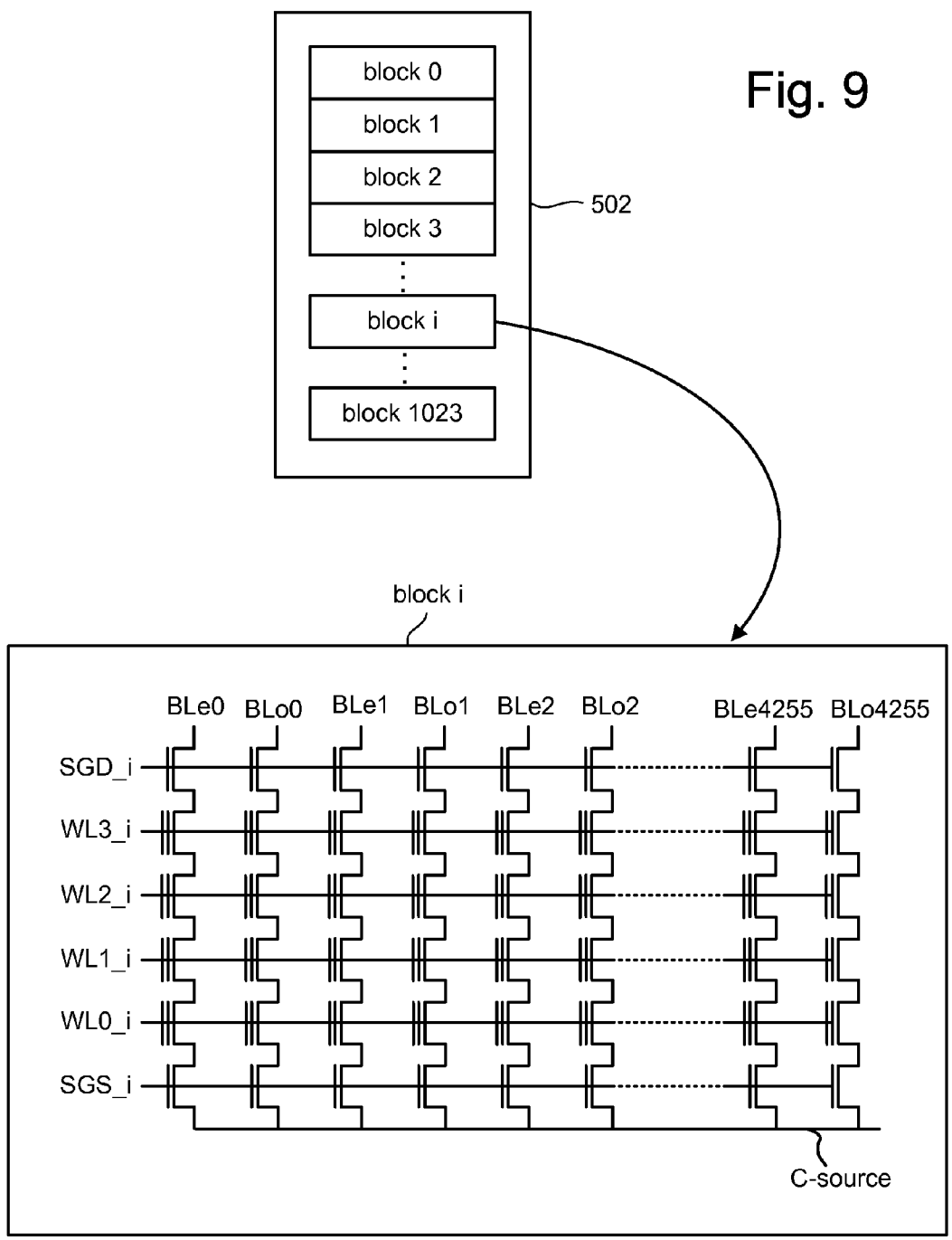
FIG. 9 illustrates an example of an organization of a memory array.

With reference to FIG. 9, an exemplary structure of memory cell array 502 is described. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 9 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages.

In the read and verify operations, the select gates (SGD and SGS) of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 2.4V, for example, so that as programming progresses it is verified whether or not the threshold voltage has reached 2.4V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

When programming a memory cell in one example, the drain and the p-well receive 0 volts while the control gate receives a series of programming pulses with increasing magnitudes. In one embodiment, the magnitudes of the pulses in the series range from 7 volts to 20 volts. In other embodiments, the range of pulses in the series can be different, for example, having a starting level of higher than 7 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 10:
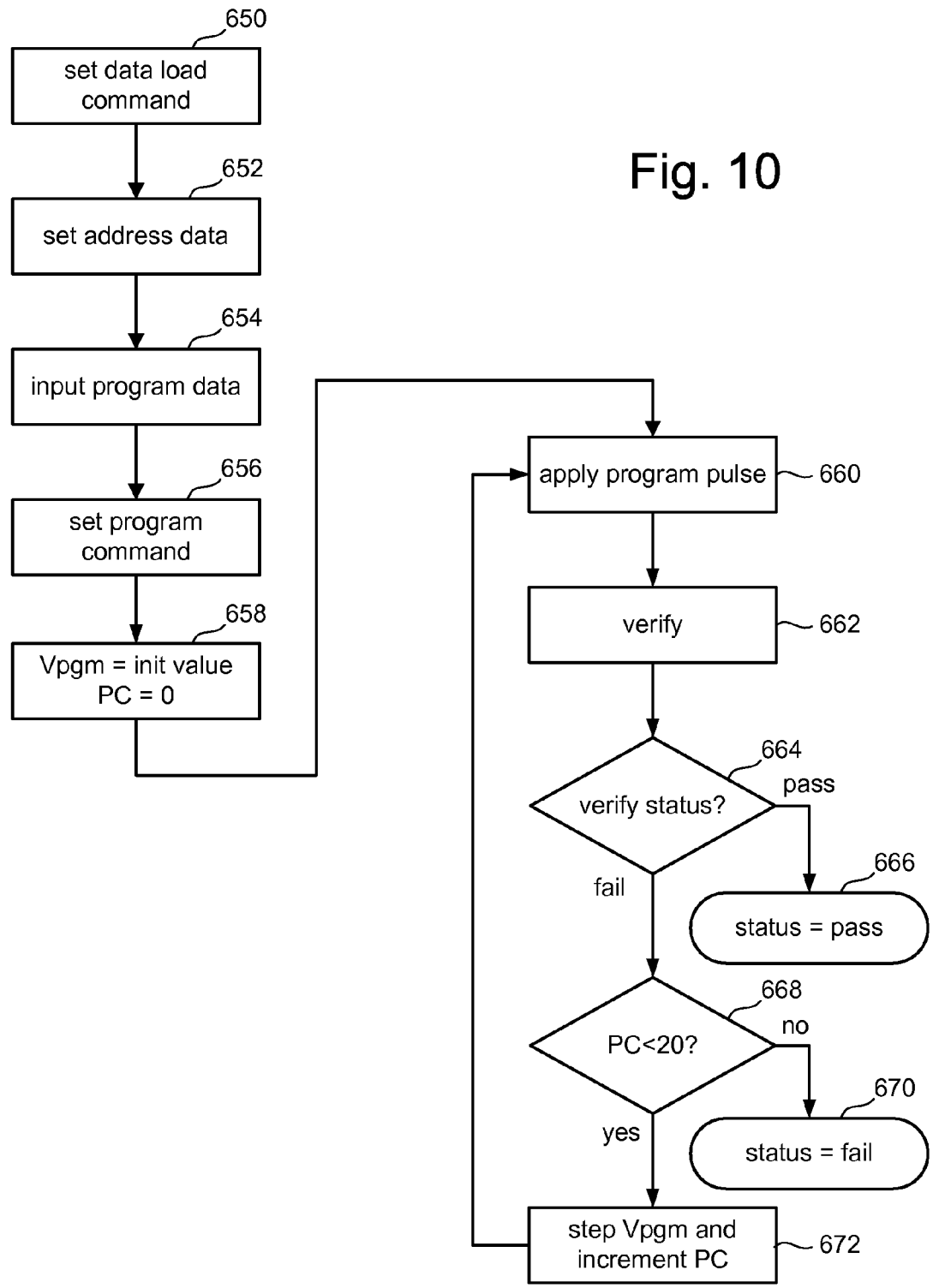
FIG. 10 is a flow chart describing one embodiment of a process for programming non-volatile memory devices.

FIG. 10 is a flowchart describing a method for programming a non-volatile memory system. As will be apparent to those of ordinary skill in the art, various steps can be modified, added, or removed depending on a specific application or implementation while still remaining within the scope and spirit of the present disclosure. In various implementations, memory cells are erased (in blocks or other units) prior to programming. At step 650 of FIG. 10 (and in reference to FIG. 8), a data load command is issued by controller 518 and input to command circuit 514, allowing data to be input to data input/output buffer 512. The input data is recognized as a command and latched by state machine 516 via a command latch signal, not illustrated, input to command circuits 514. In step 652, address data designating the page address is input to row controller 506 from controller 518. The input data is recognized as the page address and latched via state machine 516, effected by the address latch signal input to command circuits 514. At step 654, 532 bytes of program data are input to data input/output buffer 512. It should be noted that 532 bytes of program data are specific to the particular implementation described, and other implementations will require or utilize various other sizes of program data. That data can be latched in a register for the selected bit lines. In some embodiments, the data is also latched in a second register for the selected bit lines to be used for verify operations. At step 656, a program command is issued by controller 318 and input to data input/output buffer 512. The command is latched by state machine 316 via the command latch signal input to command circuits 514

At step 658, Vpgm, the programming pulse voltage level applied to the selected word line, is initialized to the starting pulse (e.g. 12 volts), and a program counter PC maintained by state machine 516, is initialized at 0. At step 660, a program voltage (Vpgm) pulse is applied to the selected word line. The bit lines that include a memory cell to be programmed are grounded to enable programming, while the other bit lines are connected to Vdd to inhibit programming during application of the programming pulse.

At step 662, the states of the selected memory cells are verified. If it is detected that the target threshold voltage of a selected cell has reached the appropriate level (for example, the programmed level for logic 0 or a particular state of a multi-state cell), then the selected cell is verified as programmed to its target state. If it is detected that the threshold voltage has not reached the appropriate level, the selected cell is not verified as programmed to its target state. Those cells verified as programmed to their target state at step 362 will be excluded from further programming. At step 664, it is determined whether all cells to be programmed have been verified to have programmed to their corresponding states, such as by checking an appropriate data storage register designed to detect and signal such a status. If so, the programming process is complete and successful because all selected memory cells were programmed and verified to their target states. A status of pass is reported in step 666. If at step 664, it is determined that not all of the memory cells have been so verified, then the programming process continues. At step 668, the program counter PC is checked against a program limit value. One example of a program limit value is 20. If the program counter PC is not less than 20, then the program process is flagged as failed and a status of fail is reported at step 670. If the program counter PC is less than 20, then the Vpgm level is increased by the step size and the program counter PC is incremented at step 672. After step 672, the process loops back to step 660 to apply the next Vpgm program pulse. At the end of a successful program process, the threshold voltages of the memory cells should be within one or more distributions of threshold voltages for programmed memory cells or within a distribution of threshold voltages for erased memory cells.

The flowchart of FIG. 10 depicts a single-pass programming method as can be applied for binary storage. In a two-pass programming method as can be applied for multi-level storage, for example, multiple programming or verification steps may be used in a single iteration of the flowchart. Steps 360-372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 11:
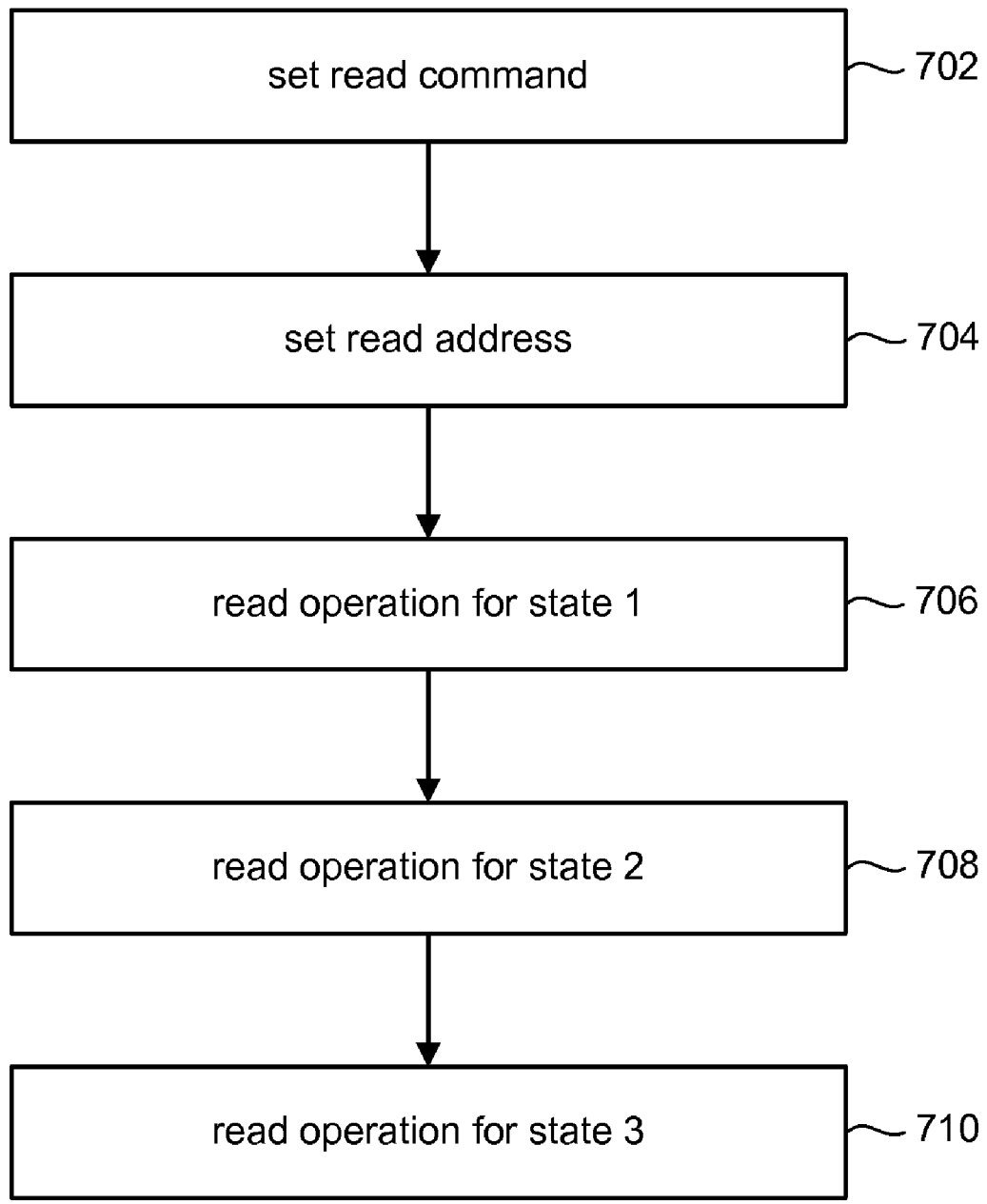
FIG. 11 is a flow chart describing one embodiment of a process for reading non-volatile memory devices.

FIG. 11 is a flow chart describing one embodiment of a process for reading a memory cell in array 502. In step 702, a read command is received from the host and stored in the state machine. In step 704, an address is received and stored. The process of FIG. 11 assumes a four state memory cell, with an erased state and three programmed states. Therefore, in one embodiment, three read operations are performed in order to read the data stored in the memory cell. If the memory has eight states, then seven read operations are performed; if the memory has sixteen states, then fifteen read operations are performed, etc. In step 706, the first read operation is performed. A first read compare point, equivalent to a threshold voltage between state 0 and state 1 is applied to the selected word line, and the sense amplifier on each bit line makes a binary decision as to whether the cell at the intersection of the selected word line and the corresponding bit line is on or off. If the cell is detected to be on, then it is read as being in state 0, otherwise the cell is in state 1, 2 or 3. In other words, if the threshold voltage of the memory cell is greater than the first read compare point, the memory cell is assumed to be in the erased state 0.

In step 708, the second read operation is performed. A second read compare point, equivalent to a threshold voltage between state 2 and state 1 is applied to the selected word line, and the sense amplifier on each bit line makes a binary decision as to whether the cell at the intersection of the selected word line and the corresponding bit line is on or off. An "off" bit line indicate that the corresponding memory cell is either in state 0 or in state 1. An "on" bit line indicates that the corresponding memory cell is in either state 2 or state 3.

In step 710, the third read operation is performed. A third read compare point, equivalent to a threshold voltage between state 3 and state 2 is applied to the selected word line, and the sense amplifier on each bit line makes a binary decision as to whether the cell at the intersection of the selected word line and the corresponding bit line is on or off. An "off" bit line will indicate that the corresponding cell is either in state 0, in state 1, or in state 2. An "on" bit line will indicate that the corresponding memory cell is in state 3. The information obtained during the three sequential steps explained above is stored in latches. A decoder is used to combine the results of the three read operations in order to find the state of each cell. For example, state 1 would be a result of the following three read results: on in step 706, off in step 708, and off in step 710. The above sequence of the read operations can be reversed, corresponding to the verify waveform sequence depicted in FIG. 5. Note that other read processes can also be used with the present invention.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A nonvolatile memory system, comprising:
   a substrate;
   a first dielectric layer formed above said substrate;
   a first conductive layer having a first portion that is subdivided into floating gates for a first group of storage elements of said nonvolatile memory system and a second portion that is subdivided into floating gates for a second group of storage elements of said nonvolatile memory system, said floating gates each including a top and two substantially vertical sidewalls;
   a trench etched in said substrate between said first portion and said second portion of said first conductive layer, said trench is filled with a grown dielectric material;
   a second dielectric layer formed above said first portion and said second portion of said first conductive layer; and
   a second conductive layer formed above said second dielectric layer, said second conductive layer including control gates for said first group of storage elements and said second group of storage elements, said second conductive layer is subdivided into word lines of said nonvolatile memory system, said word lines extending substantially below said tops of said floating gates and being separated from said tops and said substantially vertical sidewalls of said floating gates by said second dielectric layer.

2. The nonvolatile memory system of claim 1, wherein:
   said first portion of said first conductive layer includes a top and at least one sidewall;
   said second portion of said first conductive layer includes a top and at least one sidewall, said at least one sidewall of said first portion is adjacent to said at least one sidewall of said second portion;
   said second dielectric layer includes first portions formed above said top of said first portion of said first conductive layer and said top of said second portion of said first conductive layer;
   said second dielectric layer includes second portions formed along said at least one sidewall of said first portion of said first conductive layer and along said at least one sidewall of said second portion of said first conductive layer; and
   said second conductive layer extends below said top of said first potion of said first conductive layer and said top of said second potion of said first conductive layer between said second portions of said second dielectric layer.

3. The nonvolatile memory system of claim 1, wherein:
   said grown dielectric material extends into said substrate from said trench such that a width and depth of said grown dielectric material is wider and deeper than a width and depth of said trench.

4. The nonvolatile memory system of claim 1, wherein:
   said first group of storage elements is a first NAND string of nonvolatile storage elements; and
   said second group of storage elements is a second NAND string of nonvolatile storage elements.

5. The nonvolatile memory system of claim 4, wherein:
   said word lines include a first word line extending substantially below said top of a first non-volatile storage element of said first NAND string and extending substantially below said top of a second non-volatile storage element of said second NAND string, said first word line being separated from said substantially vertical sidewalls of said first floating gate and said substantially vertical sidewalls of said second floating gate by said second dielectric layer.

6. The nonvolatile memory system of claim 1, wherein:
   said two substantially vertical sidewalls of said floating gates extend in a column direction and face a row direction, said column direction and said row direction being substantially perpendicular; and
   said word lines extend across said substrate in said row direction.

7. The nonvolatile memory system of claim 1, wherein:
   said first and second groups of storage elements are part of an array of nonvolatile storage elements;
   said array is in communication with a host system; and
   said array is removable from said host system.

8. The nonvolatile memory system of claim 1, wherein:
   said substrate includes at least one of a P-well and an N-well.

9. The nonvolatile memory system of claim 1, wherein:
   said grown dielectric material is a thermally grown oxide.

10. A nonvolatile memory system, comprising:
    a substrate;
    a first NAND string having a first dielectric portion and a first conductive portion formed over a surface of said substrate, said first conduction portion including a top and two substantially vertical sidewalls;

a second NAND string having a second dielectric portion and a second conductive portion formed over said surface of said substrate, said second conductive portion including a top and two substantially vertical sidewalls;

an isolation trench formed in said substrate between an active area associated with said first NAND string and an active area associated with said second NAND string, said isolation trench is filled with a grown dielectric material isolating said first NAND string from said second NAND string;

a dielectric layer extending over said first tops and along said two substantially vertical sidewalls of said first conductive portion and said second conductive portion; and a control gate layer extending over said tops of said first conductive portion and said second conductive portion, said control gate layer extending substantially below said tops and being separated from said two substantially vertical sidewalls of said first and second conductive portions by said dielectric layer.

11. The nonvolatile memory of claim 10, wherein:

said first conductive portion is subdivided into a plurality of floating gates for a plurality of nonvolatile storage elements of said first NAND string, each floating gate including a portion of said top of said first conductive portion and portions of said two substantially vertical sidewalls of said first conductive portion; and said second conductive portion is subdivided into a plurality of floating gates for a plurality of a nonvolatile storage elements of said second NAND string, each floating gate including a portion of said top of said second conductive portion and portions of said two substantially vertical sidewalls of said second conductive portion.

12. The nonvolatile memory of claim 11, wherein:

said control gate layer is subdivided into a plurality of control gates for said first NAND string and said second NAND string, each control gate extending over one floating gate of said first NAND string and an adjacent floating gate of said second NAND string.

13. The nonvolatile memory of claim 12, wherein each control gate of said plurality forms a word line for a row of non-volatile storage elements.

14. The nonvolatile memory system of claim 10, wherein:

said grown dielectric material extends into said substrate from said trench such that a width and depth of said grown dielectric material is wider and deeper than a width and depth of said isolation trench.

15. A nonvolatile memory, comprising:

a substrate;

a first column of floating gates formed over a surface of said substrate with a first dielectric layer therebetween, said floating gates of said first column each having a top and two substantially vertical sidewalls, said two substantially vertical sidewalls extending in a column direction and facing a row direction;

a second column of floating gates formed over said surface of said substrate with said first dielectric layer therebetween, said floating gates of said second column each having a top and two substantially vertical sidewalls, said two substantially vertical sidewalls extending in said column direction and facing said row direction;

a trench in said substrate elongated in said column direction between an active area associated with said first column and an active area associated with said second column, said trench is filled with a grown dielectric material;

a second dielectric layer formed along said tops and said two substantially vertical sidewalls of said floating gates of said first column and said second column; and a set of control gates elongated in said row direction across said first and second columns of floating gates, each control gate extending over a top of one floating gate of said first column and over a top of an adjacent floating gate of said second column, said each control gate extending substantially below said tops of said one floating gate and said adjacent floating gate, said each control gate being separated from said tops and said substantially vertical sidewalls of said one floating gate and said adjacent floating gate by said second dielectric layer.

16. The nonvolatile memory of claim 15, wherein:

said first column of floating gates is part of a first NAND string; and said second column of floating gates is part of a second NAND string.

17. The nonvolatile memory of claim 15, wherein:

each control gate of said set forms a word line for a row of nonvolatile storage elements.

18. The nonvolatile memory of claim 15, wherein:

said grown dielectric material has a width in said row direction that is larger than a width of said trench in said row direction.

19. The nonvolatile memory of claim 15, wherein said grown dielectric material is a thermally grown oxide.

* * * * *